United States Patent
Desai et al.

(10) Patent No.: US 7,276,952 B2
(45) Date of Patent: Oct. 2, 2007

(54) CLOCK SIGNAL GENERATION USING DIGITAL FREQUENCY SYNTHESIZER

(75) Inventors: Jayen J. Desai, Wellington, CO (US); Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/261,337

(22) Filed: Oct. 28, 2005

(65) Prior Publication Data

US 2007/0096789 A1 May 3, 2007

(51) Int. Cl.
*G06F 1/04* (2006.01)
*H03B 21/00* (2006.01)

(52) U.S. Cl. .............. 327/291; 327/105; 327/156

(58) Field of Classification Search .......... 327/105, 327/113, 156–159, 147, 291–293; 375/376, 375/354
See application file for complete search history.

(56) References Cited

U.S. PATENT DOCUMENTS

| | | | | |
|---|---|---|---|---|
| 5,493,243 A | * | 2/1996 | Ghoshal | 327/158 |
| 5,631,933 A | * | 5/1997 | Chu et al. | 375/354 |
| 5,815,540 A | * | 9/1998 | Aoki | 375/376 |
| 6,285,172 B1 | * | 9/2001 | Torbey | 323/237 |
| 6,931,243 B2 | * | 8/2005 | Goldman | 455/260 |
| 7,123,064 B2 | * | 10/2006 | Parikh | 327/149 |

OTHER PUBLICATIONS

U.S. Appl. No. 11/232,154, filed Sep. 21, 2005, for "Clock Recovery" of Jayen Desai.

\* cited by examiner

*Primary Examiner*—Dinh T. Le (57) ABSTRACT

A method of generating a clock signal using a digital frequency synthesizer includes providing a base clock to the digital frequency synthesizer, comparing a phase of an output clock from the digital frequency synthesizer with a phase of a reference signal, and issuing at least one frequency control command to the digital frequency synthesizer to align the phases.

9 Claims, 5 Drawing Sheets

CLOCK SIGNAL GENERATION USING DIGITAL FREQUENCY SYNTHESIZER

BACKGROUND

Most complex electronic circuits operate in synchronous mode and require an oscillating clock signal to synchronize various actions throughout the circuit. The design and placement of clock generation and distribution circuitry is particularly sensitive because a clock signal is delayed as it passes through buffers and along lengthy conductive routes. The likelihood of errors or faults during operation of the circuit can increase as uncompensated delay in a clock signal increases, particularly when moving between different clock domains. For example, when communicating with off-chip interfaces, the insertion delay of the on-chip clock distribution tree should be compensated for to prevent phase errors between the on-chip clock and the off-chip clock at the interface. Conventional phase-locked loops (PLLS) may be used to adjust the phase of clock signals by placing the entire clock tree in the feedback loop to the PLL. However, long feedback loops may tend to make the PLL unstable or introduce a lengthy settling time after adjustment. Testing of the electronic circuit is also complicated by analog phase-locked loops because it can be difficult to introduce phase errors to determine the operating margins of the circuit.

SUMMARY

An exemplary method of generating a clock signal using a digital frequency synthesizer includes providing a base clock to the digital frequency synthesizer, comparing a phase of an output clock from the digital frequency synthesizer with a phase of a reference signal, and issuing at least one frequency control command to the digital frequency synthesizer to align the phases.

BRIEF DESCRIPTION OF THE DRAWINGS

Illustrative embodiments are shown in the accompanying drawings as described below.

DESCRIPTION

The drawings and description, in general, disclose a method and apparatus for generating a clock signal using a digital frequency synthesizer. The method and apparatus for generating a clock signal may be applied in any environment in which a clock signal is used, such as an on-chip clock distribution tree for an off-chip interface. The digital frequency synthesizer generates the clock signal distributed by the on-chip clock distribution tree. A phase comparator compares a reference signal such as the off-chip clock with the output of the on-chip clock distribution tree and detects whether the clocks are offset, that is, whether they are out of phase. The output of the phase comparator adjusts the phase of the output clock from the digital frequency synthesizer by modifying its frequency temporarily. By modifying the frequency temporarily, the period of the signal is changed so that the output clock cycle is longer or shorter during the temporary adjustment period. When the frequency is then returned to normal, the next clock cycle will begin earlier or later than before, shifting its phase according to the direction and degree of the frequency shift. If the phase of the output clock is to be delayed, a command is issued during one clock cycle to the digital frequency synthesizer to reduce the output frequency, followed by a command during the next clock cycle to increase the output frequency, returning the frequency to its normal value. The net effect of this operation is to retard the clock's phase with respect to the reference clock. Similarly, the phase of the output clock may be advanced by increasing the frequency of the digital frequency synthesizer briefly.

One exemplary embodiment of the method and apparatus for generating a clock signal using a digital frequency synthesizer provides an all-digital clock system and control mechanism so that the feedback loop of any phase-locked loops (PLLS) or delay-locked loops (DLLS) need not include the large delay of the on-chip clock distribution tree. The stability of the PLLS or DLLS is thus enhanced and the time required for them to settle is reduced. Digital filtering mechanisms may also be applied to the input or output of the phase comparator to increase loop stability. The phase comparator may use any of a number of suitable sources for a reference signal, such as the off-chip clock, or other on-chip clocks, thereby optimizing timing paths on chip which cross between different clock domains. Because the interface is digital, a test input such as a Joint Test Action Group (JTAG) input may be included to offset the phase of the output clock from the digital frequency synthesizer. For example, the output clock phase may be shifted a fixed degree away from its calibrated position in order to test timing paths which cross between the clock domain of the digital frequency synthesizer and the clock domain of the reference signal. This greatly facilitates testing and product characterization.

Figure 1:
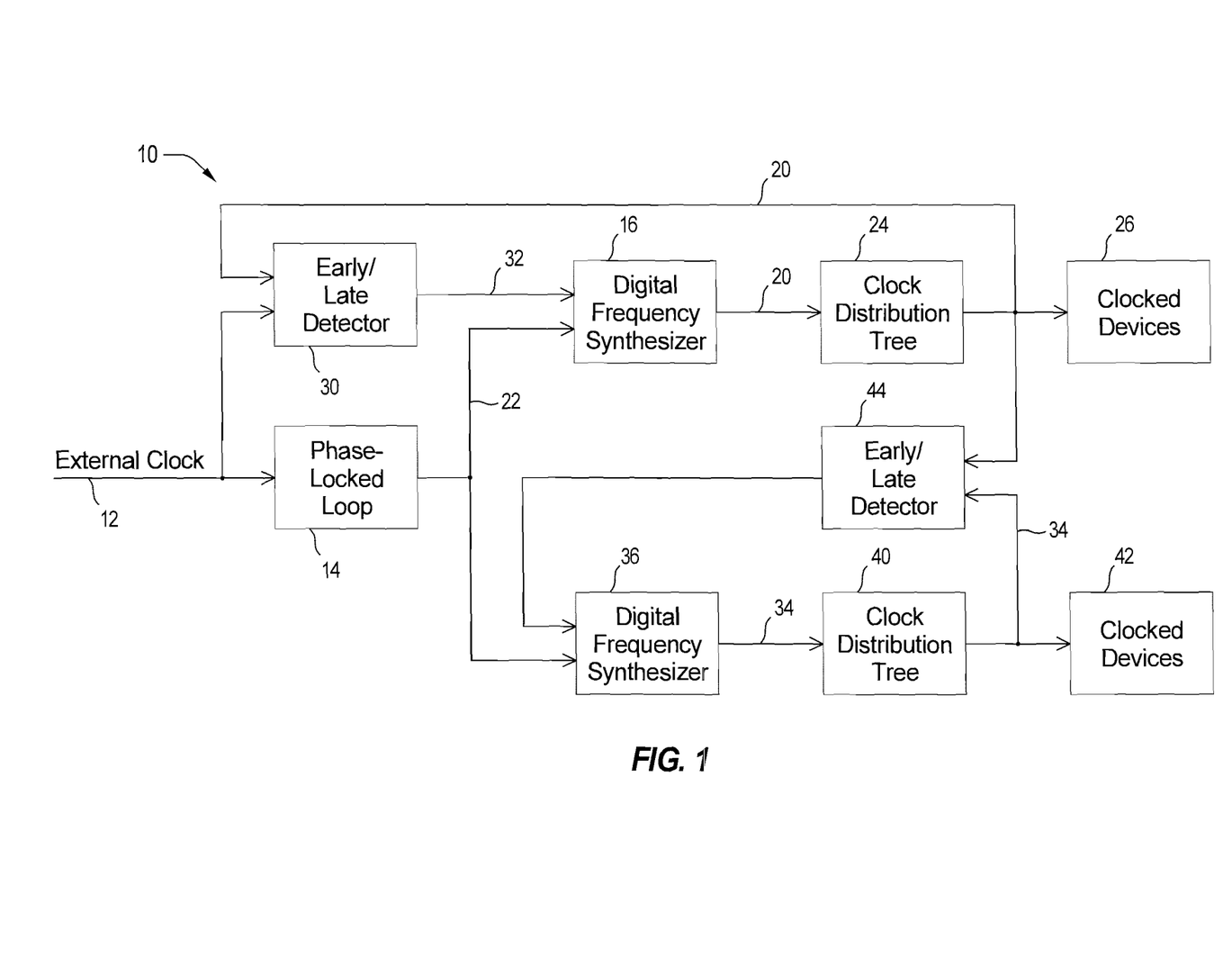
FIG. 1 is a block diagram illustrating an exemplary circuit including two digital frequency synthesizers in which phase may be adjusted using frequency control commands.

An exemplary circuit 10 including two digital frequency synthesizers is illustrated in FIG. 1. The exemplary circuit 10 is fabricated as an integrated circuit on a semiconductor die, or chip, although the method and apparatus for generating a clock signal using a digital frequency synthesizer is not limited to this exemplary embodiment. An external clock 12 may be provided to a phase-locked loop 14 or other clock source, for example if needed to multiply the frequency of the external clock 12 to a higher frequency used on the chip.

A digital frequency synthesizer 16 generates a clock signal 20 based on a base clock such as the output 22 of the phase-locked loop 14, the external clock 12, or another signal as desired. The clock signal 20 is distributed by a clock distribution tree 24 to any devices such as flip-flops and latches (e.g., 26) needing a clock. The clock distribution tree 24 may introduce delays in the clock signal 20 due to the propagation time required for the clock signal 20 to travel along conductive traces or due to delays in clock buffers in the clock distribution tree 24. The clock signal 20 may be used by devices (e.g., 26) at any point along the clock distribution tree 24.

An early/late detector 30 compares the clock signal 20 with a reference signal, such as the external clock 12, to determine the phase difference between the clock signal 20 and the reference signal (e.g., 12). The early/late detector 30 produces a phase differential signal 32 representing the phase differential between the clock signal 20 and the reference signal (e.g., 12), which is used to control the frequency of the digital frequency synthesizer 16. Frequency increase and decrease commands are issued to the digital frequency synthesizer 16 based on the phase differential signal 32 to align the clock signal 20 and the reference signal (e.g., 12) as discussed above. Note that the clock signal 20 may be connected to the early/late detector 30 at any point along the clock distribution tree 24 at which the clock signal 20 is to be aligned with the reference signal (e.g., 12), such as at the end of the clock distribution tree 24.

In one exemplary embodiment, the digital frequency synthesizer 16 is placed on a chip or semiconductor die to generate an on-chip clock (e.g., 20) based on an external clock (e.g., 12) from off-chip. Multiple on-chip clocks (e.g., 20, 34) may be generated from the external clock (e.g., 12) using multiple digital frequency synthesizers (e.g., 16, 36). For example, one on-chip clock 20 may be used to clock core elements of the chip, while another on-chip clock 34 may be used for input/output (I/O) timing etc. The second on-chip clock 34 is also generated by a digital frequency synthesizer 36 which, in this exemplary embodiment, generates its output clock signal 34 based on the same output 22 of the phase-locked loop 14 as the first digital frequency synthesizer 16. Note that the frequencies of the two clock signals 20 and 34 may be different. The clock signal 34 generated by the second digital frequency synthesizer 36 also passes through a clock distribution tree 40 to be used by devices (e.g., 42) needing a clock. The clock signal 34 is compared with a reference signal (e.g., the first clock signal 20) in an early/late detector 44, and frequency adjustment commands are generated for the digital frequency synthesizer 36 to align the phase of the clock signal 34 with the reference signal 20.

The clock signals (e.g., 20, 34) may be aligned with any desired reference signal as long as the frequency of the faster signal is an integer multiple of the frequency of the slower, such as the reference signal (e.g., 20) being an integer multiple of the base clock (e.g., 22) or vice versa. In the exemplary embodiment illustrated in FIG. 1, the clock signal 20 from one digital frequency synthesizer 16 is aligned with the external clock 12, and the clock signal 34 from the other digital frequency synthesizer 36 is aligned with the clock signal 20 from the first digital frequency synthesizer 16. In this way, multiple clock trees or domains may be provided, optionally running at different frequencies, and may be aligned with various reference signals or with each other.

Figure 2:
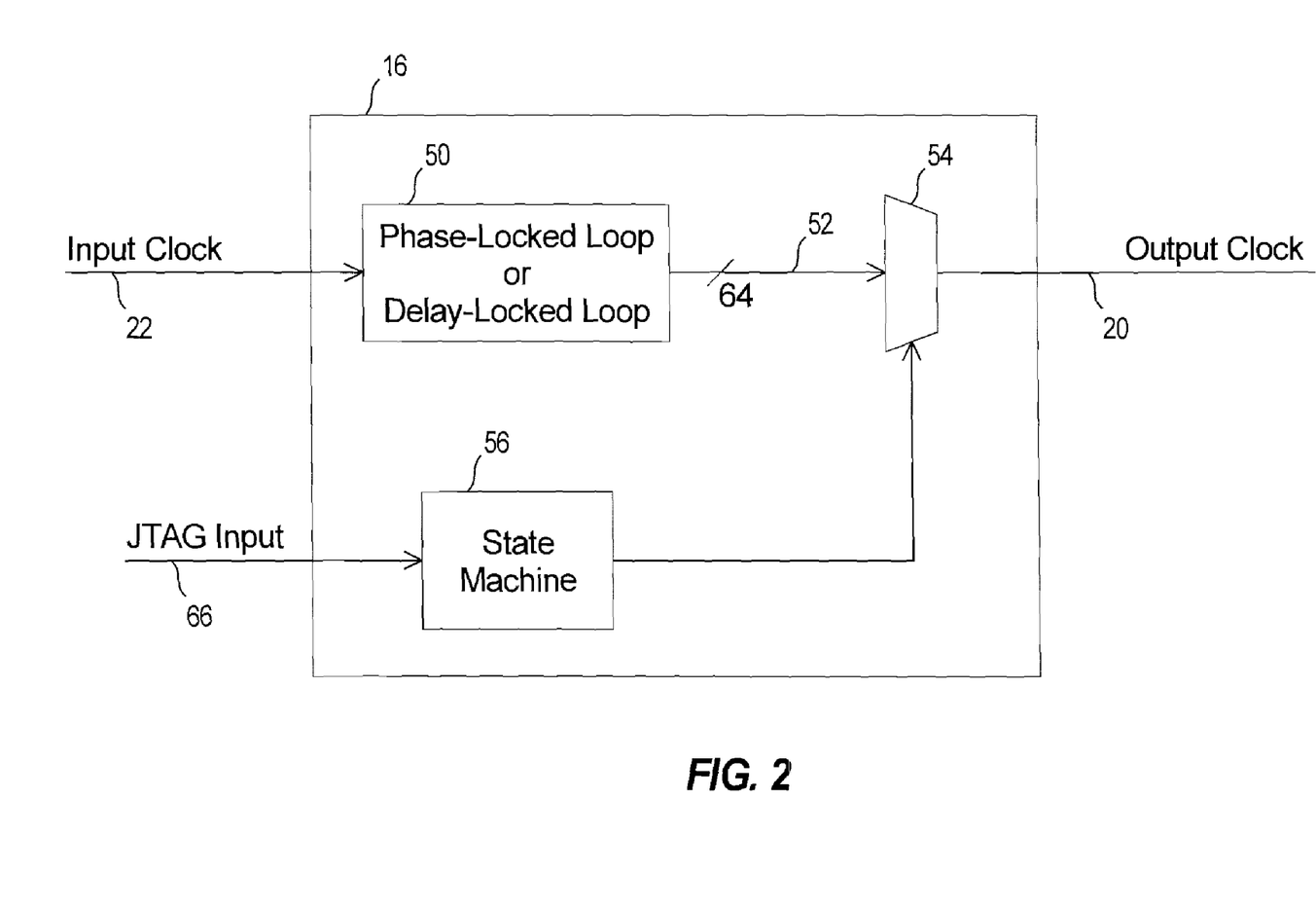
FIG. 2 is a block diagram of an exemplary digital frequency synthesizer in which phase may be adjusted using frequency control commands.

The digital frequency synthesizer (e.g., 16 and 36) may comprise any suitable digital clock generator in which output frequency can be increased and decreased. In one exemplary embodiment, the digital frequency synthesizer 16 (see FIG. 2) may include a delay-locked loop 50 having a multi-tap delay line. Alternatively, the digital frequency synthesizer 16 may comprise a phase-locked loop adapted to provide multiple delay lines each with unique phases. Each of the multiple outputs 52 (referred to herein as intermediate signals) of the delay line are tapped in or connected to the delay line at different locations, so that each carries the output clock signal with a unique phase shift. The exemplary digital frequency synthesizer 16 generates N intermediate signals 52 based on an input clock 22, each of the N intermediate signals 52 having a phase offset from the next by 1/N of the input clock cycle. For example, the digital frequency synthesizer 16 may internally generate 64 intermediate signals 52, the phase of each being offset by 1/64 of the period of the input clock 20. The digital frequency synthesizer 16 selects one of the N intermediate signals 52 at a time as the output 20 from the digital frequency synthesizer 16, such as by a multiplexer 54 controlled by a state machine 56. By changing the intermediate signal that is selected to provide the output clock signal, the output frequency of the digital frequency synthesizer 16 may be adjusted.

Figure 3:
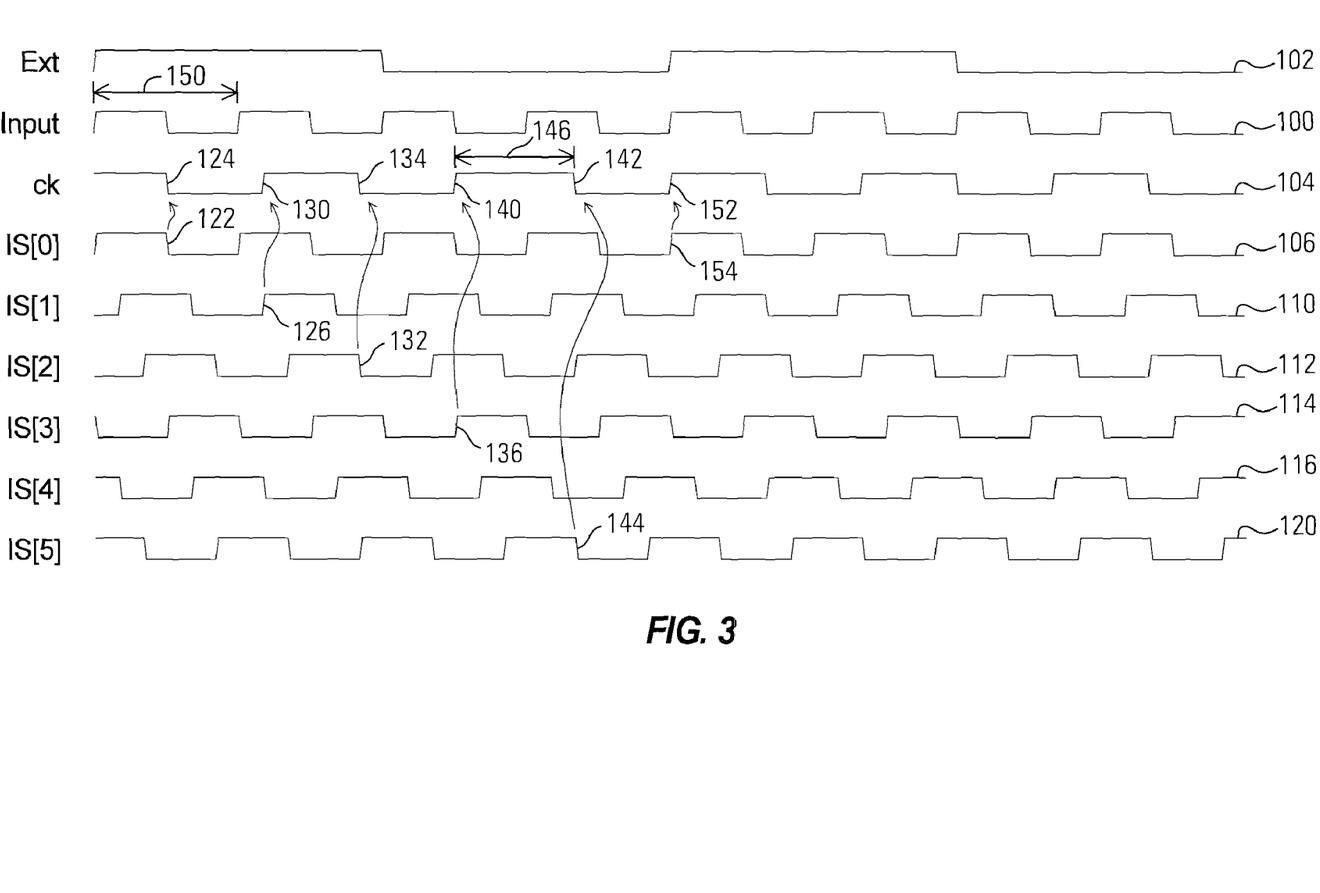
FIG. 3 is a timing diagram illustrating the frequency synthesis and phase adjustment operation of the exemplary digital frequency synthesizer of FIG. 2.

This exemplary process is illustrated in the timing diagram of FIG. 3. For the exemplary timing diagram, an input clock 100 for the digital frequency synthesizer is generated from an external (off-chip) clock 102. In this case, the frequency of the input clock 100 is four times that of the external clock 102. The digital frequency synthesizer generates an output clock 104 from the input clock 100, in this case, at an output frequency of ¾ that of the input clock 100. Note that the output clock 104 illustrated in FIG. 3 is sampled at the circuit location at which the clock 104 is to be aligned with the external clock 102, such as after the clock distribution tree. The digital frequency synthesizer generates six intermediate signals 106, 110, 112, 114, 116 and 120. The phases of the six intermediate signals 106-120 are offset by ⅙ of the period of the input clock 100, with the first intermediate signal IS[0] 106 being in phase with the input clock 100 in this example. Frequency increase and decrease commands may be issued to the digital frequency synthesizer to adjust the phase by selecting various intermediate signals 106-120 as the output clock 104. As described above, these frequency increase and decrease commands may be generated by comparing two signals such as the output clock 104 and the external clock 102.

At the beginning of normal operation in the exemplary timing diagram of FIG. 3, the falling edge 122 of the first intermediate signal IS[0] 106 triggers a falling edge 124 of the output clock 100. The next rising edge 126 of the second intermediate signal IS[1] 110 triggers the subsequent rising edge 130 of the output clock 104, and so on, with the next falling edge 132 of the third intermediate signal IS[2] 112 triggering the next falling edge 134 of the output clock 104, and the next rising edge 136 of the fourth intermediate signal IS[3] 114 triggering the next rising edge 140 of the output clock 104. The frequency of the output clock 104 is ¾ that of the input clock 102, or 3 times that of the external clock 102.

Note that the output clock 104 is initially out of phase with the external clock 102. A frequency decrease command is therefore issued to the digital frequency synthesizer to adjust the phase of the output clock 102 to align it with the external clock 102. The frequency is decreased in the digital frequency synthesizer by triggering the next falling edge 142 of the output clock 102 based on a falling edge 144 of the sixth intermediate signal IS[5] 120 rather than the fifth intermediate signal IS[4] 116. The period 146 of a half-cycle of the output clock 104 is therefore briefly increased to ⅚ of the period 150 of the input clock 100, thereby briefly decreasing the output frequency to ⅗ of that of the input frequency rather than ¾. A frequency increase command is then issued to the digital frequency synthesizer to return to the normal desired frequency of ¾ that of the input clock 102. The next rising edge 152 of the output clock 104 is therefore triggered by the next rising edge 154 of the first intermediate signal IS[0] 106. The digital frequency synthesizer continues normal operation in this manner.

If a large phase differential is detected by the early/late detector (e.g., 30), the phase of the digital frequency synthesizer output may be adjusted slowly over multiple clock cycles using a small frequency adjustment, or quickly using a larger frequency adjustment as desired.

Figure 4:
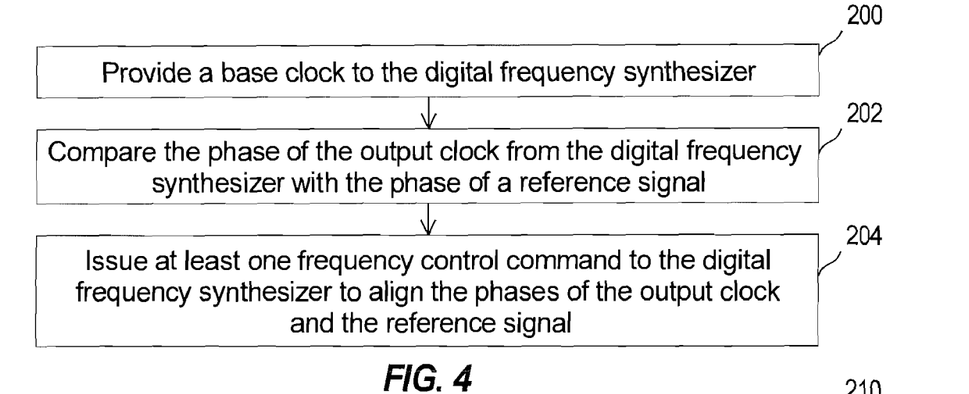
FIG. 4 is a flow chart summarizing an exemplary operation for generating a clock signal using a digital frequency synthesizer, including adjusting phase using frequency control commands.
Figure 5:
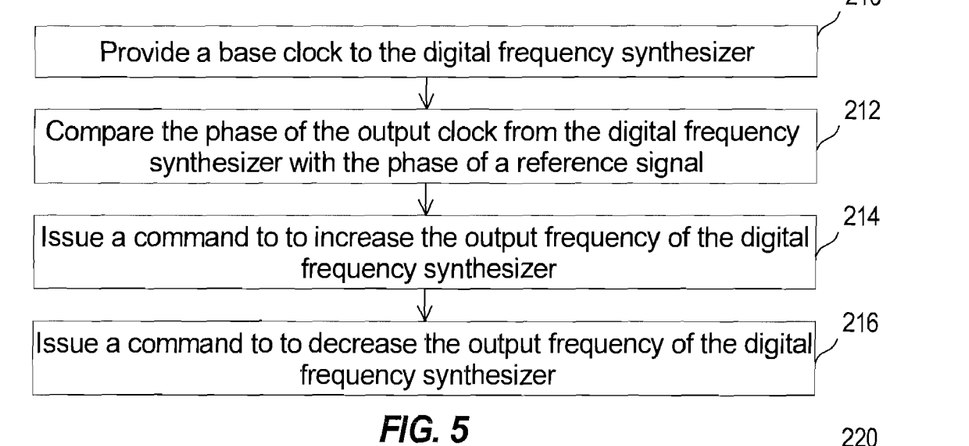
FIG. 5 is a flow chart summarizing an exemplary operation for generating a clock signal using a digital frequency synthesizer using a frequency increase command then a frequency decrease command.
Figure 6:
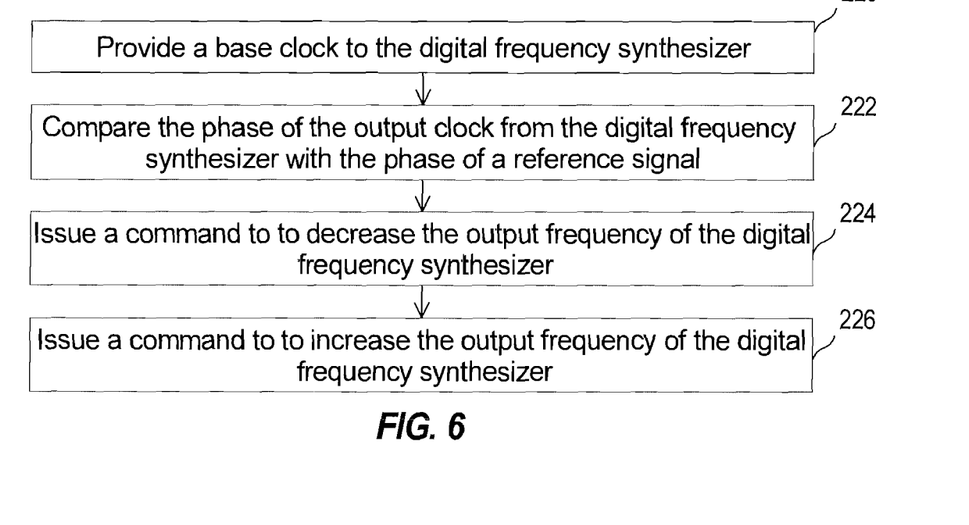
FIG. 6 is a flow chart summarizing an exemplary operation for generating a clock signal using a digital frequency synthesizer using a frequency decrease command then a frequency increase command.

An exemplary operation for generating a clock signal using a digital frequency synthesizer is summarized in the flow chart of FIG. 4. A base clock is provided 200 to the digital frequency synthesizer, the phase of the output clock from the digital frequency synthesizer is compared 202 with a phase of a reference signal, and at least one frequency control command is issued 204 to the digital frequency synthesizer to align the phases of the output clock with the reference signal. An exemplary operation for generating a clock signal using a digital frequency synthesizer using a frequency increase command then a frequency decrease command is summarized in the flow chart of FIG. 5. A base clock is provided 210 to the digital frequency synthesizer, the phase of the output clock from the digital frequency synthesizer is compared 212 with a phase of a reference signal, a command to increase the output frequency of the digital frequency is issued 214 and a command to decrease the output frequency of the digital frequency is issued 216. An exemplary operation for generating a clock signal using a digital frequency synthesizer using a frequency decrease command then a frequency increase command is summarized in the flow chart of FIG. 6. A base clock is provided 220 to the digital frequency synthesizer, the phase of the output clock from the digital frequency synthesizer is compared 222 with a phase of a reference signal, a command to decrease the output frequency of the digital frequency is issued 224 and a command to increase the output frequency of the digital frequency is issued 226. Note that the frequency control commands may be generated based on any desired event, such as the phase comparison of any two signals. Note also that the frequency control commands, or frequency increase and decrease commands, are equivalent to period decrease and increase commands, respectively.

The phase comparator or early/late detector (e.g., 30) may comprise any suitable device for comparing the phases of two signals, or detecting whether an edge of one signal arrives earlier or later than an edge of another signal. For example, the early/late detector (e.g., 30) may comprise a circuit such as that described in U.S. patent application Ser. No. 11/232,154 for "Clock Recovery", filed Sep. 21, 2005, which is incorporated herein by reference for all that it discloses. The early/late detector (e.g., 30) determines the direction and degree of phase difference and may generate frequency increment and decrement commands to be transmitted to the digital frequency synthesizer to minimize the phase difference. For example, the early/late detector (e.g., 30) may issue a frequency increment command to the digital frequency synthesizer during one clock cycle, followed by a frequency decrement command during the subsequent clock cycle, thereby advancing the phase by one fraction according to the granularity of the delay line in the digital frequency synthesizer. In an alternative embodiment, the early/late detector (e.g., 30) may transmit an indication of the direction and degree of phase difference to the digital frequency synthesizer, and a component of the digital frequency synthesizer, such as the state machine (e.g., 56), would generate the appropriate frequency control commands or adjustments. Thus, the output from the early/late detector (e.g., 30) may be implemented in any suitable manner, such as two distinct signals, a frequency increase signal (or period decrease signal) and a frequency decrease signal (or period increase signal), or alternatively, a command bus on which frequency or period values or direction and degree of phase difference are transmitted. The early/late detector (e.g., 30) and/or state machine (e.g., 56) may perform some averaging of phase differential measurements if desired to increase stability of the system.

Note that if the two clock signals compared by the early/late detector (e.g., 30) are running at different frequencies, these clocks may be divided down to their least common multiple in the early/late detector (e.g., 30) to facilitate phase comparison. For example, if the early/late detector (e.g., 30) compares the output clock (e.g., 20) of the digital frequency synthesizer (e.g., 16) with the external clock 12, and the output clock (e.g., 20) is running at a higher frequency, the output clock (e.g., 20) may be divided down in the early/late detector (e.g., 30). In this case, given an output clock frequency of 2 GHz and an external clock frequency of 200 MHz, the early/late detector (e.g., 30) would divide the output clock frequency down to 200 MHz to facilitate comparison with the 200 MHz external clock 12.

The method and apparatus for generating a clock signal using a digital frequency synthesizer may also include a test input 66 for introducing an artificial amount of phase skew between the two clock signals being compared. This allows one to use the JTAG input 66 to force a known skew between the two aligned clock domains, facilitating characterization and testing of the timing margins across the interface. In one exemplary embodiment, testing may be performed by allowing the two clock trees to become aligned via the phase comparator mechanism. A JTAG command is issued which causes both digital frequency synthesizers to ignore phase comparator inputs. At this point, the clocks are still aligned. A JTAG command is then issued to cause one of the digital frequency synthesizers to advance or retard its phase using frequency increment or decrement commands. The JTAG commands to advance or retard the phase may be used to skew the clocks by one or more sub-phases. In one exemplary embodiment, each JTAG command moves the clock by one phase step, and multiple JTAG commands may be issued if the clock is to be skewed by more than one phase step. In an alternative embodiment, a single JTAG command may be used to specify the number of phase steps by which to skew the clock, for example using a counter that is initialized by the JTAG command and that counts out a series of frequency increase or decrease commands.

Figure 7:
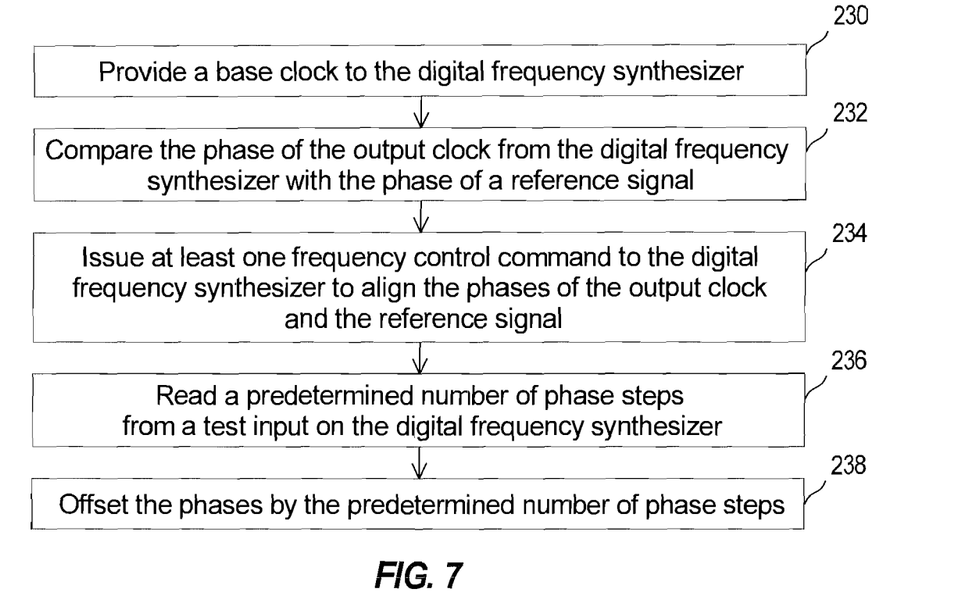
FIG. 7 is a flow chart summarizing an exemplary operation for generating a clock signal using a digital frequency synthesizer, the clock signal having a phase offset specified at a test input.
Figure 8:
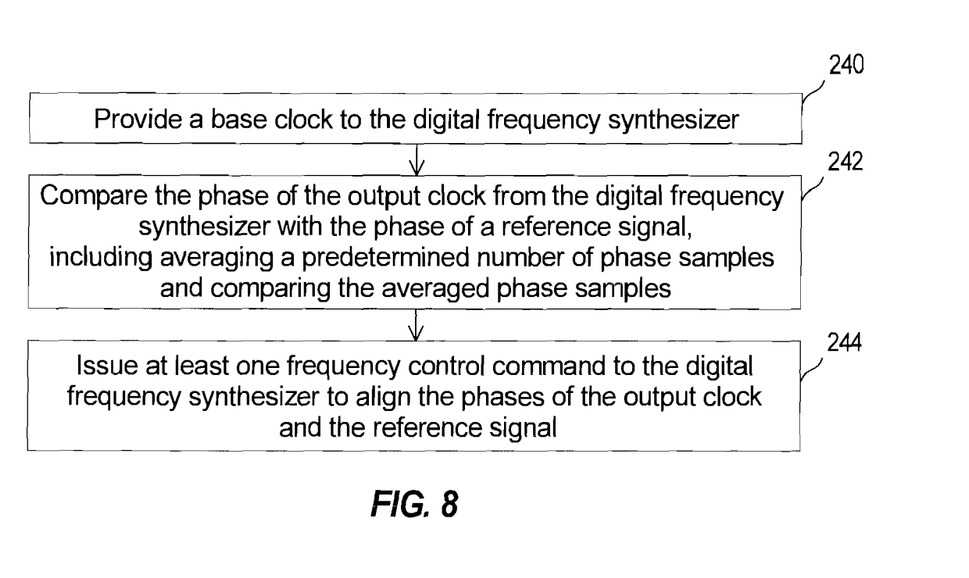
FIG. 8 is a flow chart summarizing an exemplary operation for penetrating a clock signal using a digital frequency synthesizer, including averaging of phase samples.

An exemplary operation for generating a clock signal using a digital frequency synthesizer, the clock signal having a phase offset specified at a test input, is summarized in the flow chart of FIG. 7. A base clock is provided 230 to the digital frequency synthesizer, the phase of the output clock from the digital frequency synthesizer is compared 232 with a phase of a reference signal, at least one frequency control command is issued 234 to the digital frequency synthesizer to align the phases of the output clock with the reference signal, a predetermined number of phase steps is read 236 from a test input on the digital frequency synthesizer, and the phases are offset 238 by the predetermined number of phase steps. An exemplary operation for generating a clock signal using a digital frequency synthesizer, including averaging of phase samples, is summarized in the flow chart of FIG. 8. A base clock is provided 240 to the digital frequency synthesizer, the phase of the output clock from the digital freguency synthesizer is compared 242 with a phase of a reference signal, including averaging a predetermined number of phase samples and comparing the averaged phase samples, and at least one frequency control command is issued 244 to the digital frequency synthesizer to align the phases of the output clock with the reference signal.

The method and apparatus for generating a clock signal using a digital frequency synthesizer described herein provides digital control that increases stability and simplifies design, as well as providing selectable variation in output clock phase for testing purposes.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A method of generating a clock signal using a digital freguency synthesizer, comprising:
   providing a base clock to said digital freguency synthesizer;
   comparing a phase of an output clock of said digital frequency synthesizer with a phase of a reference signal;
   issuing at least one frequency control command to said digital frequency synthesizer to align said phases, said at least one frequency control command comprising a command to increase an output frequency of said digital frequency synthesizer followed by a command to decrease said output frequency of said digital frequency synthesizer.

2. The method of claim 1, wherein said command to increase said output frequency is issued during a cycle of said output clock, and said command to decrease said output frequency is issued during a next cycle of said output clock.

3. The method of claim 1, said at least one frequency control command comprising period increase and decrease commands.

4. A method of generating a clock signal using a digital frequency synthesizer, comprising:
   providing a base clock to said digital frequency synthesizer;
   comparing a phase of an output clock of said digital frequency synthesizer with a phase of a reference signal;
   issuinq at least one frequency control command to said digital frequency synthesizer to align said phases, said at least one frequency control command comprising a command to decrease an output frequency of said digital frequency synthesizer followed by a command to increase said output frequency of said digital frequency synthesizer.

5. The method of claim 4, wherein said command to decrease said output frequency is issued during a cycle of said output clock, and said command to increase said output frequency is issued during a next cycle of said output clock.

6. A method of generating a clock signal using a digital frequency synthesizer, comprising:
   providing a base clock to said digital frequency synthesizer;
   comparing a phase of an output clock of said digital frequency synthesizer with a phase of a reference signal;
   issuing at least one frequency control command to said digital frequency synthesizer to align said phases;
   reading a predetermined number of phase steps from a test input on said digital frequency synthesizer; and
   offsetting said phases by said predetermined number of phase steps.

7. A method of generating a clock signal using a digital frequency synthesizer, comprising:
   providing a base clock to said digital frequency synthesizer;
   comparing a phase of an output clock of said digital frequency synthesizer with a phase of a reference signal, said comparing further comprising averaging a predetermined number of phase samples and comparing said averaged phase samples;
   issuing at least one frequency control command to said digital frequency synthesizer to align said phases.

8. An apparatus for generating a clock signal, the apparatus comprising:
   a digital frequency synthesizer having a reference clock input, a clock output and at least one freguency adjustment command input;
   a base clock signal connected to said reference clock input;
   a phase comparator having first and second inputs and a command output, said first input being connected to a reference signal, said second input being connected to said digital frequency synthesizer clock output, and said command output being connected to said digital frequency synthesizer frequency adjustment command input, said digital frequency synthesizer further comprising a phase offset test input for offsetting a phase of said digital frequency synthesizer clock output by a number of phase steps specified by a signal on said phase offset test input.

9. The apparatus of claim 8, said digital frequency synthesizer comprising a state machine and a plurality of selectable clock outputs, each running at a unique phase, said digital frequency synthesizer clock output being connected to one of said plurality of selectable clock outputs under control of said state machine, wherein said phase offset test input is connected to said state machine to influence which of said plurality of selectable clock outputs is connected to said digital frequency synthesizer clock output.

* * * * *

UNITED STATES PATENT AND TRADEMARK OFFICE
CERTIFICATE OF CORRECTION

PATENT NO. : 7,276,952 B2  Page 1 of 1
APPLICATION NO. : 11/261337
DATED : October 2, 2007
INVENTOR(S) : Jayen J. Desai et al.

It is certified that error appears in the above-identified patent and that said Letters Patent is hereby corrected as shown below:

In column 2, line 2, delete "penetrating" and insert -- generating --, therefor.

In column 6, line 63, delete "freguency" and insert -- frequency --, therefor.

In column 7, line 6, delete "freguency" and insert -- frequency --, therefor.

In column 7, line 26, in Claim 1, delete "freguency" and insert -- frequency --, therefor.

In column 7, line 52, in Claim 4, delete "issuinq" and insert -- issuing --, therefor.

In column 8, line 32, in Claim 8, delete "freguency" and insert -- frequency --, therefor.

Signed and Sealed this

Seventeenth Day of June, 2008

JON W. DUDAS
*Director of the United States Patent and Trademark Office*